United States Patent
Li et al.

(10) Patent No.: US 10,490,109 B2
(45) Date of Patent: Nov. 26, 2019

(54) ARRAY SUBSTRATE AND TESTING METHOD AND MANUFACTURING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Liangliang Li, Beijing (CN); Zongjie Guo, Beijing (CN); Xiangqian Ding, Beijing (CN); Yao Liu, Beijing (CN); Jinchao Bai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 1051 days.

(21) Appl. No.: 14/404,180

(22) PCT Filed: Dec. 12, 2013

(86) PCT No.: PCT/CN2013/089301
§ 371 (c)(1),
(2) Date: Nov. 26, 2014

(87) PCT Pub. No.: WO2015/027615
PCT Pub. Date: Mar. 5, 2015

(65) Prior Publication Data
US 2015/0325159 A1   Nov. 12, 2015

(30) Foreign Application Priority Data
Aug. 29, 2013 (CN) .......................... 2013 1 0384877

(51) Int. Cl.
*H01L 27/12* (2006.01)
*G09G 3/00* (2006.01)
(Continued)

(52) U.S. Cl.
CPC ............. *G09G 3/006* (2013.01); *G01R 31/28* (2013.01); *G02F 1/1309* (2013.01);
(Continued)

(58) Field of Classification Search
CPC .............................. G01R 31/28; H01L 27/124
(Continued)

(56) References Cited

U.S. PATENT DOCUMENTS 5,504,348 A * 4/1996 Yoshida ............ G02F 1/136204
257/363
6,013,923 A * 1/2000 Huang .............. G02F 1/136204
257/356
(Continued)

FOREIGN PATENT DOCUMENTS

CN    101546774 A    9/2009
CN    101551964 A    10/2009
(Continued)

OTHER PUBLICATIONS

English translation of the International Preliminary Report on Patentability and Written Opinion of the International Searching Authority of PCT/CN2013/089301, dated Mar. 1, 2016.
(Continued)

*Primary Examiner* — Jami Valentine Miller
(74) *Attorney, Agent, or Firm* — Collard & Roe, P.C.

(57) ABSTRACT

An array substrate, a testing method and a manufacturing method of the array substrate are disclosed. The array substrate comprises a first test line (3), a second test line (4), and first data lines (1) and second data lines (2) that are disposed alternately. The first data lines (1) are directly
(Continued)

connected to the first test line (3), and the second data lines (2) are connected to the second test line (4) through switch elements (7); or, the second data lines (2) are directly connected to the second test line (4), and the first data lines (1) are connected to the first test line (3) through switch elements (7). With the array substrate, charges in the display region can be avoided from being transferred to a test line, thereby decreasing the accumulation of static electricity, and enhancing reliability of the short bar region.

20 Claims, 3 Drawing Sheets

(51) Int. Cl.
*G01R 31/28* (2006.01)
*G02F 1/13* (2006.01)
*G02F 1/1362* (2006.01)

(52) U.S. Cl.
CPC ...... *G02F 1/136286* (2013.01); *H01L 27/124* (2013.01); *H01L 27/1259* (2013.01); *G02F 2001/136254* (2013.01); *G02F 2001/136272* (2013.01)

(58) Field of Classification Search
USPC ........ 702/64, 117, 150, 153; 257/363, 5, 48; 349/42; 359/245
See application file for complete search history.

(56) References Cited

U.S. PATENT DOCUMENTS

| 2002/0021376 | A1 | 2/2002 | Yoo et al. |
| 2004/0041959 | A1 | 3/2004 | Yoo et al. |
| 2004/0184131 | A1* | 9/2004 | Kurashina ......... G02F 1/136259 359/245 |
| 2006/0033857 | A1* | 2/2006 | Kim .................. G02F 1/136204 349/54 |

FOREIGN PATENT DOCUMENTS

| CN | 103149713 A | 6/2013 |
| JP | 2002277896 A | 9/2002 |
| KR | 20020014596 A | 2/2002 |

OTHER PUBLICATIONS

English Translation of the International Search Report of PCT/CN2013/089301 published in English dated May 3, 2015.
Chinese Office Action of Chinese Application No. 201310384877.0, dated Jan. 23, 2015 with English translation.
International Search Report, International Preliminary Report on Patentability and Written Opinion of the International Searching Authority of PCT/CN2013/089301 in Chinese, dated Jun. 17, 2014.

* cited by examiner

ARRAY SUBSTRATE AND TESTING METHOD AND MANUFACTURING METHOD THEREOF

CROSS REFERENCE TO RELATED APPLICATIONS

This application is the National Stage of PCT/CN2013/089301filed on Dec. 12, 2013, which claims priority under 35U.S.C. § 119 of Chinese Application No. 201310384877.0 filed on Aug. 29, 2013, the disclosure of which is incorporated by reference.

TECHNICAL FIELD

Embodiments of the present invention relate to an array substrate, and a testing method and manufacturing method thereof.

BACKGROUND

As compared with traditional cathode ray tube display devices, flat panel display devices have advantages such as lightness, thinness, low driving voltage, no flicker, no jitter, long service life, etc. Flat panel display devices can be classified into active luminous display devices and passive luminous display devices. For example, thin film transistor liquid crystal display devices (TFT-LCD) belong to a kind of passive luminous display devices. As TFT-LCDs have the merits of stable picture, lifelike image, small radiation, saving in space, saving in energy consumption, and so on, they have been widely applied to televisions, cell phones, display devices and other electronic products, and have played a leading role in the field of planar display.

A liquid crystal display device mainly includes a liquid crystal display panel and a drive device for driving the liquid crystal display panel. The liquid crystal display panel mainly includes a first substrate and a second substrate that are disposed opposite to each other; usually, the first substrate and the second substrate are an array substrate and a color filter substrate, respectively. The array substrate includes a plurality of data lines and a plurality of gate lines that intersect with each other, and a plurality of pixel units are defined by the data lines and the gate lines.

Manufacturing processes of the liquid crystal display panel are mainly classified into a front-end array process, a middle-end cell process, a back-end module assembly process and so on. In order to reduce the difficulty in testing pictures of the liquid crystal display panel in the array process and the cell process and reduce the cost of testing equipment, one of the most commonly used method in the industry at present is to arrange a shorting bar region on the array substrate. That is, some wirings for test are formed to surround data lines, gate lines and other wirings on the array substrate.

As shown in FIG. 1, a first test line 3 and a second test line 4 are formed along the periphery of an array substrate. The first test line 3 is configured for signal test on data lines in all the odd-numbered columns, and the second test line 4 is configured for signal test on data lines in all the even-numbered columns. In order to measure the resistance between two adjacent data lines, two probes of a universal meter for example contact the two adjacent data lines, respectively, and whether a short circuit occurs between these two data lines or not can be determined in accordance with the obtained resistance value. For example, if the tested resistance value is very large, then it indicates that no short circuit occurs; while the tested resistance value is very small, then it can be basically determined that a short circuit occurs.

Because the shorting bar region is arranged along the periphery of the liquid crystal display panel, and for the convenience of test, the connection to a large number of data lines or gate lines in the liquid crystal display panel is required, accumulation of electrostatic charges occurs quite easily. For example, as shown in FIG. 2, static electricity may bring about an electrostatic breakdown in the region where metal lines overlap, leading to short circuit, open circuit or other defects. Moreover, because some shorting bar regions are situated at the edge of the array substrate, many process treatments are very unstable at the edge. For example, when an aluminum-containing material is used as the substance for a test line, due to a hillock or other issue existing at the edge, electrostatic breakdown happens more easily, so that a defect happens to a shorting bar region. A defect in a shorting bar region may make the whole liquid crystal display panel determined to be a defective product in test. However, the shorting bar region is cut off during the final phase of the production, and will not affect the display effect of the final display device. So, this gives rise to misjudgement. That is, it is possible that a part of products, in which liquid crystal display panels comply with specifications but a defect is present in a shorting bar region, are misjudged as disqualified products. Therefore, the yield of display devices is affected, and on the other hand, serious waste is incurred.

SUMMARY

According to an embodiment of the present invention, there is provided an array substrate, for reducing or avoiding such an problem that qualified products are misjudged as disqualified products due to the defect of a shorting bar region. A testing method and manufacturing method of the array substrate are provided by embodiments of the invention as well.

In a first aspect of the invention, there is provided an array substrate, comprising a first test line, a second test line, and first data lines and second data lines that are disposed alternately; the first data lines are directly connected to the first test line, and the second data lines are connected to the second test line through switch elements; or, the second data lines are directly connected to the second test line, and the first data lines are connected to the first test line through switch elements.

For example, the array substrate may further include a control line for the switch elements. The switch elements are first thin film transistors; and gate electrodes of the first thin film transistors are connected to the control line.

For example, in the array substrate, the switch elements may be first thin film transistors, the first test line also functions as a control line for the switch elements, and gate electrodes of the first thin film transistors are connected to the first test line. For example, the array substrate may further include a gate metal layer and a source/drain metal layer; the control line is provided in a same layer as the gate metal layer; the second test line is connected to source electrodes of the first thin film transistors, and the second data lines are connected to drain electrodes of the first thin film transistors.

For example, in the array substrate, the second test line may be provided in a same layer as the source/drain metal layer, the first data lines and the second data lines are provided in a same layer as the source/drain metal layer; the first test line is directly connected to the first data lines through via holes, and the second test line and source electrodes of the first thin film transistors are of an integral structure.

For example, in the array substrate, the second test line may be provided in a same layer as the gate metal layer, the first data lines and the second data lines are provided in the same layer as the source/drain metal layer; the first test line is directly connected to the first data lines through via holes, and the second test line is connected to source electrodes of the first thin film transistors through via holes.

For example, in the array substrate, the control line and gate electrodes of the first thin film transistors may be of an integral structure.

For example, the array substrate may include second thin film transistors that are arranged in an array in a display region; the first thin film transistors and the second thin film transistors are of a same construction.

In another aspect of the invention, there is further provided a method of testing any array substrate as stated above, comprising: inputting a data signal to one of the first test line and the second test line, which is connected to switch elements, and inputting no signal to the other one, so as to turn off the switch elements; if the data signal can be tested in a display region of the array substrate, then it is determined that a short circuit happens between the first test line and the second test line.

In another aspect of the invention, there is provided a manufacturing method of an array substrate, comprising: forming second thin film transistors located in a display region and forming a first test line, a second test line, and first data lines and second data lines disposed alternately that are located in a periphery region; the first data lines are directly connected to the first test line, the second data lines are connected to the second test line through switch elements; or, the second data lines are directly connected to the second test line, and the first data lines are connected to the first test line through switch elements.

For example, in the method, the switch elements may be first thin film transistors.

For example, in the method, the first thin film transistors are formed as the second thin film transistors are formed.

For example, in the method, the first test line, a gate metal layer of the first thin film transistors and a gate metal layer of the second thin film transistors, and a control line are formed on a base substrate; a gate insulating layer covering the entire base substrate is formed; an active layer of the first thin film transistors and an active layer of the second thin film transistors are formed; the first data lines, the second data lines, the second test line, and a source/drain metal layer of the first thin film transistors and a source/drain metal layer of the second thin film transistors are formed; a passivation layer and via holes are formed.

For example, in the method, the first test line, the second test line, a gate metal layer of the first thin film transistors and a gate metal layer of the second thin film transistors, and a control line are formed on a base substrate; a gate insulating layer covering the entire base substrate is formed; an active layer of the first thin film transistors and an active layer of the second thin film transistors are formed; the first data lines, the second data lines, the second test line, and a source/drain metal layer of the first thin film transistors and a source/drain metal layer of the second thin film transistors are formed; a passivation layer and via holes are formed.

For example, in the method, the control line and gate electrodes of the first thin film transistors may be configured to be of an integral structure.

For example, in the method, the control line may be the first test line.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

REFERENCE NUMERALS

1: first data line; 2: second data line; 3: first test line; 4: second test line; 5: via hole; 6: connection line; 7: first thin film transistor.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Embodiment 1

In the embodiment, there is firstly provided an array substrate, which has a display region and a peripheral region surrounding the display region. The array substrate includes a plurality of gate lines and a plurality of data lines that are arranged to intersect with each other to define pixel regions in the display region, and each of the pixel regions is provided with a second thin film transistor (a thin film transistor for pixel switching); and the aforesaid data lines include first data lines and second data lines that are disposed alternately. For example, in the embodiment, data lines in all the odd-numbered columns are called as the first data lines, and data lines in all the even-numbered columns are called as the second data lines; of course, data lines in all the even-numbered columns can be called as the first data lines while data lines in all the odd-numbered columns can be called as the second data lines, and so forth. In the periphery region of the array substrate, there are further provided a first test line, a second test line and switch elements, and the first test line and the second test line are insulated from each other. The first data lines are directly connected to the first test line, while the second data lines are connected to the second test line through switch elements respectively; or the second data lines are directly connected to the second test line, while the first data lines are connected to the first test line through switch elements respectively. For the convenience of control, the switch elements as stated above may be thin film transistors or other controllable analog switches.

Hereinafter, the array substrate provided by the embodiment will be described with reference to the example in which the first data lines are directly connected to the first test line, the second data lines are connected to the second test line through switch elements, and switch elements are first thin film transistors.

Figure 1:
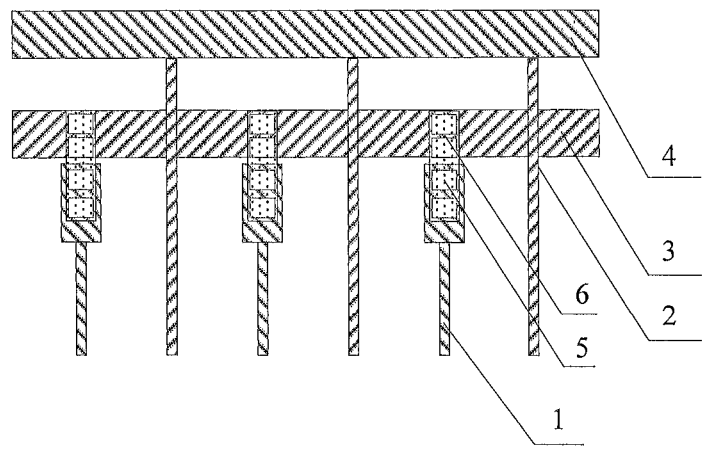
FIG. 1 is a partially schematic view illustrating a traditional array substrate.
Figure 2:
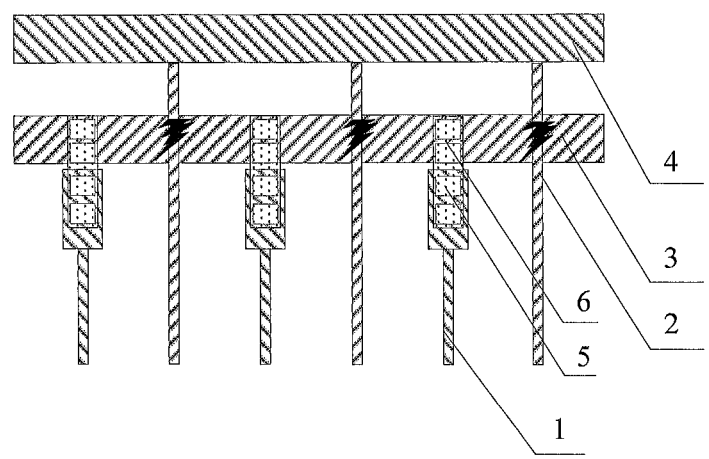
FIG. 2 is a schematic view illustrating electrostatic breakdown that takes place in a traditional array substrate.
Figure 3A:
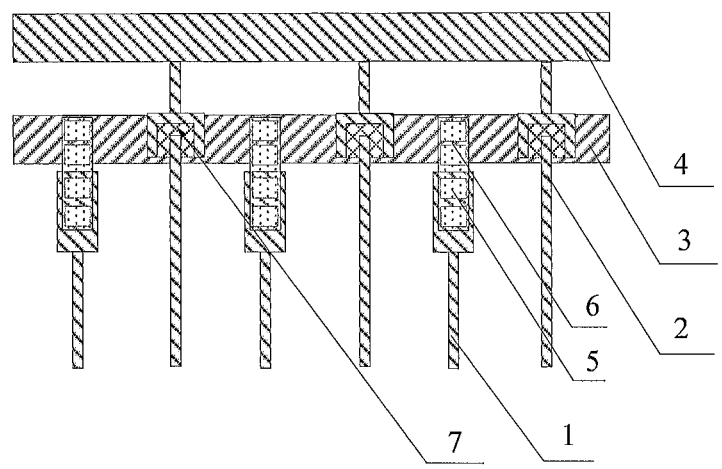
FIG. 3a is a structurally schematic view illustrating an array substrate according to Embodiment 1 of the invention.

As shown in FIG. 3a, one of the first data lines 1 is directly connected to a first test line 3 through one via hole 5 and one connection line 6; each of second data lines 2 is connected to the drain electrode of one first thin film transistor 7, a second test line 4 is connected to the source electrode of the first thin film transistor 7, and the gate electrode of the first thin film transistor 7 is connected to a control line. The control line has a function similar to a gate line in a display region of the array substrate (i.e., for controlling of turning-off or turning-on state of a thin film transistor for pixel switching), and is configured for controlling of turning-on and turning-off of the first thin film transistor. For example, when a high-level signal is applied to the control line, the first thin film transistor 7 is turned on; and when a low-level signal is applied to the control line (namely, no signal is input), the first thin film transistor 7 is turned off. In the embodiment, the control line for the first thin film transistor and the first test line 3 are the same one line, namely, the first test line 3 also functions as the control line. As shown in FIG. 3a, part of the first test line 3 is used as the gate electrode of each first thin film transistor 7. The gate electrode of the first thin film transistor 7 may also be an electrode portion that is realized by a branch out of the first test line 3.

For example, the display region of the array substrate includes a gate metal layer (including a gate electrode and a gate line), a gate insulating layer, an active layer, a source/drain metal layer (including a source electrode and a drain electrode), a data line, a passivation layer, a transparent electrode layer and so on that are sequentially provided on a base substrate from down to top. The first test line 3 in the embodiment and the gate metal layer are provided on the same layer and are made of the same material, and the second test line 4 and the source/drain metal layer as well as the data line are provided on the same layer and are made of the same material. Because the gate insulating layer is provided between the first test line 3 and the second test line 4, the first test line 3 and the second test line 4 are insulated from each other. For example, it is possible that the gate metal layer and the first test line 3 are formed simultaneously in same one process, namely, the first test line and the gate electrode of the first thin film transistor are of an integral structure. For example, the control line is also the first test line. For example, the source/drain metal line, the data line and the second test line 4 are formed simultaneously in same one process; and moreover, as the second test line 4 and the data line are provided on the same layer, the connection between the second data lines 2 and the second test line 4 can be easily realized. As such, it is unnecessary to add a separate process for forming the first test line 3 and a separate for forming the second test line 4. In order to facilitate the formation and reduce the process step(s), the first thin film transistor 7 in the embodiment may are of a same construction as a second thin film transistor in the display region of the array substrate. That is, a gate metal layer of the second thin film transistor and the gate metal layer of the first thin film transistor may be formed simultaneously, a gate insulating layer of the second thin film transistor and the gate insulating layer of the first thin film transistor 7 may be formed simultaneously, and an active layer and a source/drain metal layer of the second thin film transistor and the active layer and the source/drain metal layer of the first thin film transistor may be formed simultaneously. As such, it is unnecessary to add separate processes for forming the first thin film transistor 7; and moreover, all of the source/drain metal layer of the first thin film transistor 7, the second data lines 2 and the second test line 4 are provided on the same layer, thereby facilitating realization of a corresponding connection. For example, the second test line 4 and the source electrode of the first thin film transistor 7 are formed integrally, a second data line 2 and the drain electrode of the first thin film transistor 7 are formed integrally, and so on.

The first test line 3, the second test line 4, the switch elements and so on as stated above are merely configured for test of the array substrate, and will be etched off in a following process, or removed by cutting, laser cutting or other physical separating method for the substrate, so they will not affect the normal signal transmission of the formed array substrate.

Embodiment 2

Figure 3B:
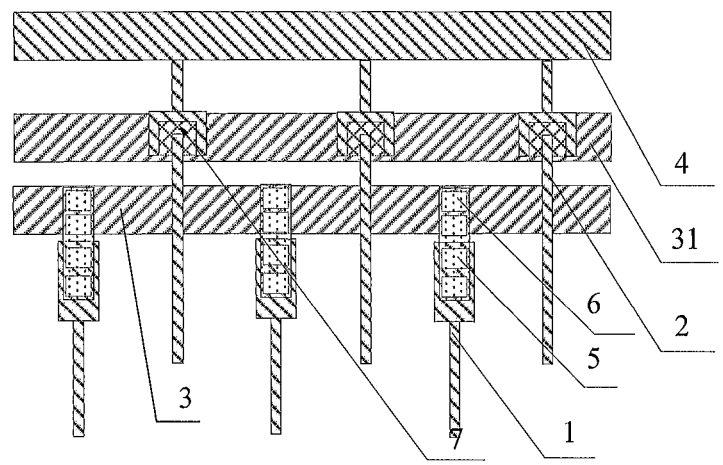
FIG. 3b is a structurally schematic view illustrating an array substrate according to Embodiment 2 of the invention.

The embodiment is a modification of Embodiment 1 and differs from Embodiment 1 in that a control line and a first test line are formed separately. As shown in FIG. 3b, each of the first data lines 1 is directly connected to a first test line 3 through one via hole 5 and one connection line 6; each of the second data lines 2 is connected to the drain electrode of one first thin film transistor. 7, a second test line 4 is connected to the source electrode of the first thin film transistor 7, and the gate electrode of the first thin film transistor 7 is connected to a control line 31. In the embodiment, the control line 31 for the first thin film transistors 7 and the first test line 3 are formed in parallel to each other. As shown in FIG. 3b, part of the control line 31 functions as the gate electrode of each first thin film transistor 7. The gate electrode of the first thin film transistor 7 may also be an electrode portion that is formed by a branch out of the control line 31.

In the situation that the first test line 3 and the control line 31 are parallel to each other as shown in FIG. 3b, for example, the first test line 3, the control line 31 and the gate metal layer are provided on the same layer and are formed of the same substance.

Embodiment 3

In the embodiment, there is further provided a method for manufacturing any of the array substrates as stated above. The difference between the method for manufacturing the array substrate and a conventional manufacturing method of an array substrate lies in that, in addition to formation of a second thin film transistor located in a display region, it is also necessary to form the switch elements as stated above. In order to simplify the process flow, in an example of the embodiment, the switch elements are first thin film transistors 7 and are formed in the same processes as the second thin film transistor in the display region. An exemplary manufacturing mode of the array substrate according to the embodiment, as shown in FIGS. 4a and 4b, can be carried out as follows.

(Step 1) By depositing, exposing, etching, developing and other patterning process, a first test line 3, a gate metal layer for a first thin film transistor 7 and a second thin film transistor, and a control line are formed on a base substrate. If the first test line 3 also functions as a control line for the first thin film transistor 7, then the first test line 3 and the gate metal layer (a gate electrode) of the first thin film transistor 7 are formed integrally, or the gate electrode of the first thin film transistor 7 is an electrode portion branching from the first test line 3. If the first test line 3 and a control line for the first thin film transistor 7 are formed separately, then the two lines are formed in parallel to each other, the control line is formed integrally with the gate metal layer for the first thin film transistor, or the gate electrode of the first thin film transistor is an electrode portion branching from the control line.

For example, by way of magnetron sputtering, thermal evaporation or the like method, a layer of metal thin film is deposited on a base substrate; a layer of photoresist is coated on the metal thin film; an exposure process is conducted with a common mask (a single-tone mask) so as to form a photoresist retained region in correspondence with a first test line 3, a gate metal layer of a first thin film transistor 7 and a gate metal layer of a second thin film transistor, and a control line, and a photoresist removed region in correspondence with other region than the above region.

Figure 4A:
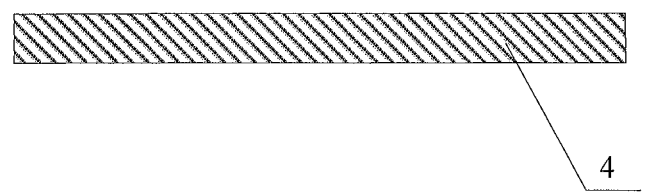
FIGS. 4a to 4d are structurally schematic views illustrating an array substrate formed in each stage of the manufacturing method for an array substrate according to Embodiment 3 of the invention.
Figure 4B:
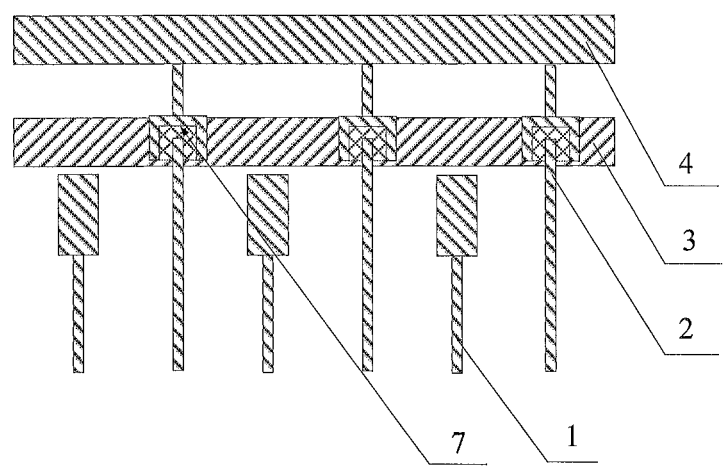

A developing treatment is conducted on the photoresist; after the developing treatment, the thickness of the photoresist in the photoresist retained region undergoes no change, and the photoresist in the photoresist removed region is removed; subsequent to the developing treatment, the metal thin film in the photoresist removed region is removed through an etching process; and finally, the remaining photoresist is stripped off, and the remained metal thin film includes the first test line 3, the gate metal layer of the first thin film transistor 7 and the gate metal layer of the second thin film transistor, and the control line as shown in FIG. 4*a*.

(Step 2) A gate insulating layer covering the whole base substrate is formed.

For example, the gate insulating layer may be such as an inorganic insulating layer of silicon oxide, silicon nitride or the like, or may be an organic insulating layer.

(Step 3) An active layer of the first thin film transistor and an active layer of the second thin film transistor are formed, and a first data line 1, a second data line 2, a second test line 4, and a source/drain metal layer of the first thin film transistor and a source/drain metal layer of the second thin film transistor are formed.

For example, by way of chemical vapor deposition or the like method, a semiconductor layer and a doped semiconductor layer are deposited on the gate insulating layer in sequence; next, a metal thin film is deposited by way of magnetron sputtering, thermal evaporation or the like method; a layer of photoresist is coated on the metal thin film; through a double-tone mask exposing process, a photoresist fully-retained region in correspondence with a source/drain metal layer for both a first thin film transistor and a second thin film transistor, a first data line 1, a second data line 2 and a second test line 4, a photoresist half-retained region in correspondence with channel regions for the first thin film transistor and the second thin film transistor, and a photoresist fully-removed region in correspondence with other region than the above regions.

After a developing treatment, the thickness of the photoresist in the photoresist fully-retained region has no change, the photoresist in the photoresist fully-removed region is removed completely, and the thickness of the photoresist in the photoresist half-retained region is thinned. Next, the metal thin film, the doped semiconductor layer and the semiconductor layer in the photoresist fully-removed region are removed through a first etching process, so as to form the patterns of an active layer of the first thin film transistor and an active layer of the second thin film transistor.

The photoresist in the photoresist half-retained region is removed by an ashing process, so as to expose the metal thin film in this region. The metal thin film and the doped semiconductor layer in the photoresist half-retained region are removed through a second etching process, and a part of the thickness of the semiconductor layer is removed, so as to form the patterns of the source/drain metal layer and the channel region for the first thin film transistor and the second thin film transistor, the first data line 1, the second data line 2 and the second test line 4 as shown in FIG. 4*b*.

After the above structures have been formed, the remaining photoresist is stripped off.

Figure 4C:
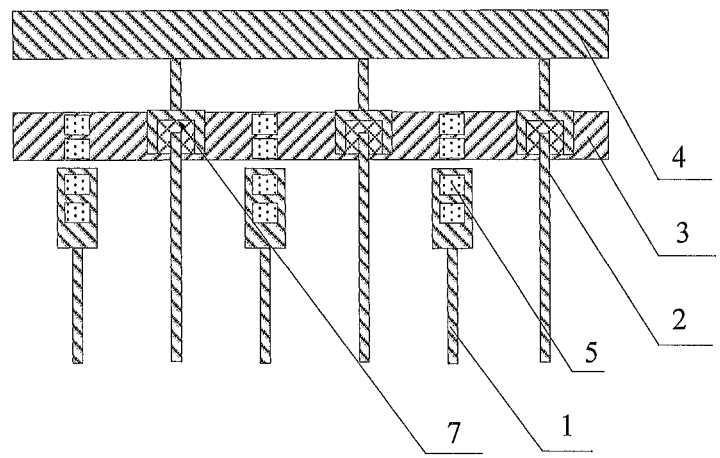

(Step 4) A passivation layer and via holes 5 as shown in FIG. 4*c* are formed. For example, a passivation layer is deposited on the source/drain metal layer and the channel regions for the first thin film transistor and the second thin film transistor, the first data line 1, the second data line 2, the second test line 4 by way of chemical vapor deposition or the like; and then, with a double-tone mask process, via holes 5 for exposing the first data line 1 and the first test line 3 are formed on the passivation layer.

Figure 4D:
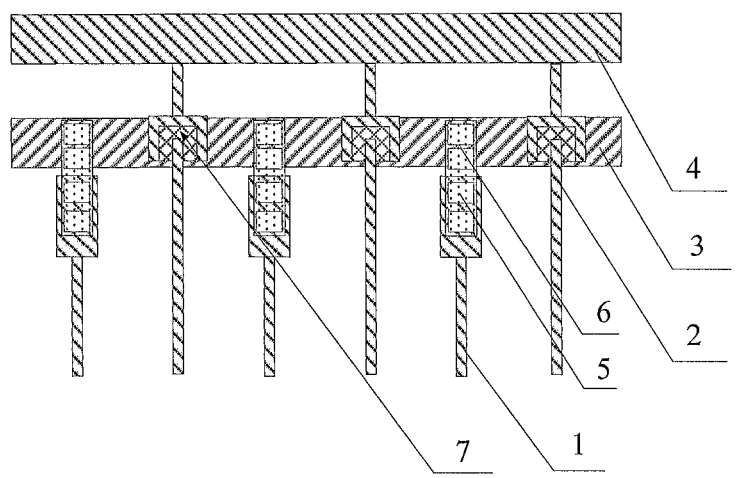

(Step 5) A transparent electrode and a connection line are formed. For example, a transparent metal thin film is deposited on the passivation layer by way of chemical vapor deposition or the like; next, with a common mask process, a connection line 6 as shown in FIG. 4*d* and a transparent electrode are formed on the transparent metal thin film. The connection line 6 each serves to connect the first data line 1 to the first test line 3 through the via holes 5.

In the above array substrate, the second test line and the source/drain metal layer are provided on the same layer. Of course, the second test line may also be provided on the same layer as the gate metal layer, the first test line is directly connected to the first data line through a via hole, and the second test line is connected to a source electrode of the first thin film transistor through a via hole. Accordingly, the manufacturing method of the array substrate also needs to be adjusted correspondingly. For example, the manufacturing method of the exemplary array substrate can be carried out as follows.

A first test line, a second test line, a gate metal layer of a first thin film transistor and a second thin film transistor, and a control line are formed on a base substrate; a gate insulating layer cover the entire base substrate is formed; an active layer of the first thin film transistor and an active layer for the second thin film transistor are formed; a first data line, a second data line and a source/drain metal layer of the first thin film transistor and the second thin film transistor are formed; a passivation layer and via holes are formed, so that the first test line is directly connected to the first data line through the via hole, and the second test line is connected to the source electrode of the first thin film transistor through the via hole.

The manufacturing method of the array substrate in the above embodiment is merely one implementation method for manufacturing the array substrate provided by the invention, and in an actual use, it is also possible that the implementation method is modified by way of increasing or decreasing the number of patterning process, selecting different materials or material combinations so as to realize the invention.

Embodiment 4

According to the embodiment, there is further provided a method for testing any array substrate as stated above. The testing method of the array substrate may be carried out as follows.

A data signal is applied to one of a first test line and a second test line that are connected to switch elements, and no signal is applied to the other one, so as to turn off the switch elements. If the data signal can be obtained in a display region of the array substrate, then it is determined that a short circuit happens between the first test line and the second test line.

For example, in an example shown in FIG. 3b, when the first test line 3 and the control line are formed separately, data signals are applied to the first test line 3 and the second test line 4, and a high-level signal is applied to the control line so as to turn on the first thin film transistors 7. In this situation, data signals can be applied to all data lines on the array substrate, so as to check whether each pixel region has a defect. At this time, the resistance between two adjacent data lines is tested, for example, two probes of a universal meter contact the two adjacent data lines, respectively. When the resistance between the two adjacent data lines is tested to be very small, it can be preliminary determined that a desirable short circuit occurs between the two data lines. However, if a short circuit exists between the first test line 3 and the second test line 4, it may result in the consequence that the resistance between two adjacent data lines is tested to be too small as well. Consequently, a qualified product is misjudged as a disqualified product. Therefore, a further test can be carried out in the testing method of the array substrate in the embodiment. For example, a data signal is stopped from being applied to the first test line 3 and the signal is stopped from being applied to the control line so as to turn off the first thin film transistor. If a data signal can be tested in a display region of the array substrate at this time, then it can be determined that the input data signal on the second test line 4 has been shunted to the first test line 3, so that it can be further determined that a short circuit happens between the first test line 3 and the second test line 4. If a data signal can not be tested in a display region of the array substrate at this time, then it can be determined that a short circuit does happen between the above adjacent data lines, so that this product can be determined as a defective product. It can be seen clearly that, with the testing method of the embodiment, the test error rate can be reduced considerably.

Further, as shown in FIG. 3a, when the above control line is the first test line 3 also, a low-level signal is input to the first test line 3, that is, a data signal is stopped from being applied to the first test line, and thus the first thin film transistor 7 can be turned off. Therefore, if the first test line 3 functions as the control line as well, on the one hand, provision of an additional control line can be avoided, the structure of the array substrate is simplified, the production cost is reduced, and furthermore, the difficulty of the manufacturing process of the array substrate is decreased; on the other hand, because it is unnecessary to apply an additional control signal for the first thin film transistor 7, the difficulty in control and the drive cost are reduced considerably.

In summary, with the array substrate and the testing method of the array substrate provided by the invention, it can be determined whether or not a short circuit happens between the first test line 3 and the second test line 4, so as to avoid such a situation in which a qualified product is misjudged as a disqualified product due to the short circuit between the first test line 3 and the second test line 4. Furthermore, out of the test process, as switch elements are in an off state, namely, a connected test line with respect to the switch elements is disconnected from a corresponding data line, charges in the display region are avoided from being transferred to the test line. Thus, the accumulation of static electricity is decreased, and reliability of the short bar region is enhanced.

Descriptions made above are merely exemplary embodiments of the invention, but are not used to limit the protection scope of the invention. The protection scope of the invention is determined by attached claims.

The invention claimed is:

1. An array substrate, comprising a first test line, a second test line, switch elements, first data lines and second data lines,
   wherein the first data lines and the second data lines are disposed alternately;
   the first data lines are directly connected to the first test line, the second data lines are respectively connected to the switch elements which are connected to the second test line, and the switch elements are respectively configured to control a connection between the second data lines and the second test line; and
   the array substrate further comprises a control line for the switch elements and the control line is connected to control ends of the switch elements.

2. The array substrate claimed as claim 1, wherein the switch elements are first thin film transistors and the control ends are gate electrodes of the first thin film transistors.

3. The array substrate claimed as claim 1, wherein the switch elements are first thin film transistors, the control ends are gate electrodes of the first thin film transistors; the first test line and the control line are of an integral structure.

4. The array substrate claimed as claim 2, further comprising a gate metal layer and a source/drain metal layer;
   wherein the control line is provided in a same layer as the gate metal layer, the second test line is connected to source electrodes of the first thin film transistors, and the second data lines are connected to drain electrodes of the first thin film transistors.

5. The array substrate claimed as claim 4, wherein the second test line is provided in a same layer as the source/drain metal layer, the first data lines and the second data lines are provided in a same layer as the source/drain metal layer; the first test line is directly connected to the first data lines through via holes, and the second test line and source electrodes of the first thin film transistors are of an integral structure.

6. The array substrate claimed as claim 4, wherein the second test line is provided in a same layer as the gate metal layer, the first data lines and the second data lines are provided in a same layer as the source/drain metal layer; the first test line is directly connected to the first data lines through via holes, and the second test line is connected to source electrodes of the first thin film transistors through via holes.

7. The array substrate claimed as claim 5, wherein the control line and gate electrodes of the first thin film transistors are of an integral structure.

8. The array substrate claimed as claim 1, further comprising second thin film transistors that are arranged in an array in a display region;
   wherein the first thin film transistors and the second thin film transistors are of a same construction.

9. A method of testing the array substrate claimed as claim 1, comprising:

inputting a data signal to the second test line, inputting no signal to the first test line and turning off the switch elements;

where the data signal is tested in a display region of the array substrate, it is determined that a short circuit happens between the first test line and the second test line.

10. A manufacturing method of an array substrate, comprising:

forming a first test line, a second test line, switch elements, first data lines and second data lines in a periphery region;

wherein the first data lines and second data lines disposed alternately;

the first data lines are directly connected to the first test line, the second data lines are respectively connected to the switch elements which are connected to the second test line, and the switch elements are respectively configured to control a connection between the second data lines and the second test line;

the manufacturing method further comprises forming a control line for the switch elements and the control line is connected to control ends of the switch elements.

11. The manufacturing method of the array substrate claimed as claim 10, wherein the switch elements are first thin film transistors.

12. The manufacturing method of the array substrate claimed as claim 11, comprising:

forming second thin film transistors in a display region as the first thin film transistors are formed.

13. The manufacturing method of the array substrate claimed as claim 12, further comprising:

forming the first test line, a gate metal layer of the first thin film transistors and a gate metal layer of the second thin film transistors;

forming a gate insulating layer covering the entire base substrate;

forming an active layer of the first thin film transistors and an active layer of the second thin film transistors;

forming the first data lines, the second data lines, the second test line, and a source/drain metal layer of the first thin film transistors and a source/drain metal layer of the second thin film transistors;

forming a passivation layer and via holes.

14. The manufacturing method of the array substrate claimed as claim 12, further comprising:

forming the first test line, the second test line, a gate metal layer of the first thin film transistors and a gate metal layer of the second thin film transistors;

forming a gate insulating layer covering the entire base substrate;

forming an active layer of the first thin film transistors and an active layer of the second thin film transistors;

forming the first data lines, the second data lines, the second test line, and a source/drain metal layer of the first thin film transistors and a source/drain metal layer of the second thin film transistors;

forming a passivation layer and via holes.

15. The manufacturing method of the array substrate claimed as claim 13, wherein the control line and gate electrodes of the first thin film transistors are configured to be of an integral structure.

16. The manufacturing method of the array substrate claimed as claim 10, wherein the control line and the first test line are of an integral structure.

17. The array substrate claimed as claim 3, further comprising a gate metal layer and a source/drain metal layer;

wherein the control line is provided in a same layer as the gate metal layer, the second test line is connected to source electrodes of the first thin film transistors, and the second data lines are connected to drain electrodes of the first thin film transistors.

18. The array substrate claimed as claim 17, wherein the second test line is provided in a same layer as the source/drain metal layer, the first data lines and the second data lines are provided in a same layer as the source/drain metal layer; the first test line is directly connected to the first data lines through via holes, and the second test line and source electrodes of the first thin film transistors are of an integral structure.

19. The array substrate claimed as claim 17, wherein the second test line is provided in a same layer as the gate metal layer, the first data lines and the second data lines are provided in a same layer as the source/drain metal layer; the first test line is directly connected to the first data lines through via holes, and the second test line is connected to source electrodes of the first thin film transistors through via holes.

20. The array substrate claimed as claim 18, wherein the control line and gate electrodes of the first thin film transistors are of an integral structure.

* * * * *